United States Patent
Evans et al.

(10) Patent No.: US 12,550,637 B2
(45) Date of Patent: Feb. 10, 2026

(54) CONCURRENT OR CYCLICAL ETCH AND DIRECTIONAL DEPOSITION

(71) Applicant: Applied Materials, Inc., Santa Clara, CA (US)

(72) Inventors: Morgan Evans, Manchester, MA (US); John Hautala, Beverly, MA (US); Charith Nanayakkara, Gloucester, MA (US)

(73) Assignee: Applied Materials, Inc., Santa Clara, CA (US)

(*) Notice: Subject to any disclaimer, the term of this patent is extended or adjusted under 35 U.S.C. 154(b) by 379 days.

(21) Appl. No.: 18/229,544

(22) Filed: Aug. 2, 2023

(65) Prior Publication Data

US 2025/0046601 A1    Feb. 6, 2025

(51) Int. Cl.
*H01L 21/02* (2006.01)
*H01J 37/32* (2006.01)

(52) U.S. Cl.
CPC .... *H01L 21/02274* (2013.01); *H01J 37/3244* (2013.01); *H01J 37/32623* (2013.01); *H01L 21/0212* (2013.01); *H01L 21/0228* (2013.01); *H01J 2237/20207* (2013.01); *H01J 2237/20214* (2013.01); *H01J 2237/20228* (2013.01)

(58) Field of Classification Search
None
See application file for complete search history.

(56) References Cited

U.S. PATENT DOCUMENTS

| 2014/0166618 A1* | 6/2014 | Tadigadapa ....... H01L 21/31116 156/345.29 |
| 2014/0256141 A1 | 9/2014 | Cao |
| 2017/0178900 A1* | 6/2017 | Chen ...................... C23C 14/54 |
| 2018/0076007 A1 | 3/2018 | Gilchrist |
| 2018/0142355 A1 | 5/2018 | Yang |
| 2020/0194226 A1 | 6/2020 | Kurunczi |

FOREIGN PATENT DOCUMENTS

| KR | 20110092485 | * | 8/2011 |
| WO | 2014092856 A1 | | 6/2014 |

OTHER PUBLICATIONS

International Search Report and Written Opinion for International Application No. PCT/US2024/040364, mailed on Nov. 21, 2024, 9 pages.

* cited by examiner

*Primary Examiner* — Asok K Sarkar
(74) *Attorney, Agent, or Firm* — KDW Firm PLLC

(57) ABSTRACT

An etching and deposition system including a process chamber containing a platen for supporting a substrate, an reactive-ion etching (RIE) source adapted to produce an ion beam and to direct the ion beam into the process chamber for etching the substrate, a first plasma enhanced chemical vapor deposition (PECVD) source located on a first side of the RIE source, the first PECVD source adapted to produce a first radical beam and to direct the first radical beam into the process chamber for depositing a first material, and a second PECVD source located on a second side of the RIE source opposite the first side, the second PECVD source adapted to produce a second radical beam and to direct the second radical beam into the process chamber for depositing a second material.

21 Claims, 3 Drawing Sheets

CONCURRENT OR CYCLICAL ETCH AND DIRECTIONAL DEPOSITION

FIELD OF THE DISCLOSURE

Embodiments of the present disclosure relate generally to the field of semiconductor device fabrication, and more particularly to systems and methods for performing concurrent or cyclical etching and deposition.

BACKGROUND OF THE DISCLOSURE

Semiconductor device fabrication employs many discrete processes to create desired features in a semiconductor substrate. Some of these processes include lithography, etching, deposition, and ion implantation. In the case of etching, a layer of material, referred to as a hard mask or photoresist, is disposed on the surface of a semiconductor substrate to be etched. Portions of the hard mask are removed, creating openings that expose the underlying substrate. An ion beam formed of reactive plasma ions is directed at the hard mask, and the exposed portions of the underlying substrate are etched by the ion beam to create desired features (e.g., trenches) therein, while other portions of the substrate are shielded from the ion beam by the hard mask.

During the etching process, the ion beam removes material from both the hard mask and the exposed portions of the underlying substrate. Due to the characteristics of the hard mask, the material of the substrate is removed at a faster rate than the material of the hard mask. In this way, the exposed portions of the substrate are etched, while the hard mask protects other portions of the substrate.

However, as semiconductor fabrication processes continue to evolve and features become smaller and more compact, the initial openings in the hard mask prior to the etching process are becoming narrower. Such narrow openings are difficult to produce with accuracy and are prone to undesirable variations in size and shape. If these variations are not rectified, the dimensions of features etched into an underlying substrate (typically referred to as "critical dimensions" or "CDs") may vary from intended values. Additionally, a narrower opening in a hard mask generally requires a longer or more aggressive etching process to remove a desired amount of material from the underlying substrate. A longer or more aggressive etching process may remove a significant amount of material from the hard mask and/or may modify the shape of the hard mask in an undesirable manner. If too much of the hard mask is removed, the hard mask will no longer be able to protect the underlying portions of the substrate from the etching process. If the shape of the hard mask is altered during the etching process, critical dimensions may vary from intended values. To compensate for more aggressive etching processes, the hard mask may be made thicker to account for the removal of the hard mask during the etching process. Additionally, or alternatively, a different type of material, which is more resistant to etching, may be used for the hard mask. However, such modifications in a hard mask may be expensive or difficult to implement.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

An etching and deposition system in accordance with an embodiment of the present disclosure may include a process chamber containing a platen for supporting a substrate, an reactive-ion etching (RIE) source adapted to produce an ion beam and to direct the ion beam into the process chamber for etching the substrate, a first plasma enhanced chemical vapor deposition (PECVD) source located on a first side of the RIE source, the first PECVD source adapted to produce a first radical beam and to direct the first radical beam into the process chamber for depositing a first material, and a second PECVD source located on a second side of the RIE source opposite the first side, the second PECVD source adapted to produce a second radical beam and to direct the second radical beam into the process chamber for depositing a second material.

A method of performing an etching process in accordance with an embodiment of the present disclosure may employ an etching and deposition system including a process chamber, an reactive-ion etching (RIE) source adapted to produce an ion beam and to direct the ion beam into the process chamber, a first plasma enhanced chemical vapor deposition (PECVD) source located on a first side of the RIE source, the first PECVD source adapted to produce a first radical beam and to direct the first radical beam into the process chamber, and a second PECVD source located on a second side of the RIE source opposite the first side, the second PECVD source adapted to produce a second radical beam and to direct the second radical beam into the process chamber. The method may include disposing a substrate on the platen, the substrate having a top surface defining a substrate plane, disposing a hard mask on the top surface of the substrate, the hard mask having openings defining a pattern to be transferred to the substrate, performing an etching process wherein the RIE source is activated and the ion beam is directed onto the hard mask to etch the pattern into the substrate, performing a first deposition process wherein the first PECVD source is activated and the first radical beam is directed at a first side of the hard mask to deposit a first material on the first side of the hard mask, and performing a second deposition process wherein the second PECVD source is activated and the second radical beam is directed at a second side of the hard mask opposite the first side to deposit a second material on the second side of the hard mask.

A method of performing an etching process in accordance with an embodiment of the present disclosure may employ an etching and deposition system including a process chamber, an reactive-ion etching (RIE) source adapted to produce an ion beam and to direct the ion beam into the process chamber, and a plasma enhanced chemical vapor deposition (PECVD) source located adjacent the RIE source, the PECVD source adapted to produce a radical beam and to direct the radical beam into the process chamber. The method may include disposing a substrate on the platen, the substrate having a top surface defining a substrate plane, disposing a hard mask on the top surface of the substrate, the hard mask having openings defining a pattern to be transferred to the substrate, performing an etching process wherein the RIE source is activated and the ion beam is directed onto the hard mask to etch the pattern into the substrate, performing a first deposition process wherein the PECVD source is activated and the radical beam is directed at a first side of the hard mask to deposit a material on the first side of the hard mask, rotating the platen, and performing a second deposition process wherein the PECVD source is activated and the radical beam is directed at a second side of the hard mask opposite the first side to deposit the material on the second side of the hard mask.

BRIEF DESCRIPTION OF THE DRAWINGS

By way of example, various embodiments of the disclosed techniques will now be described, with reference to the accompanying drawings, wherein.

DETAILED DESCRIPTION

Figure 1:
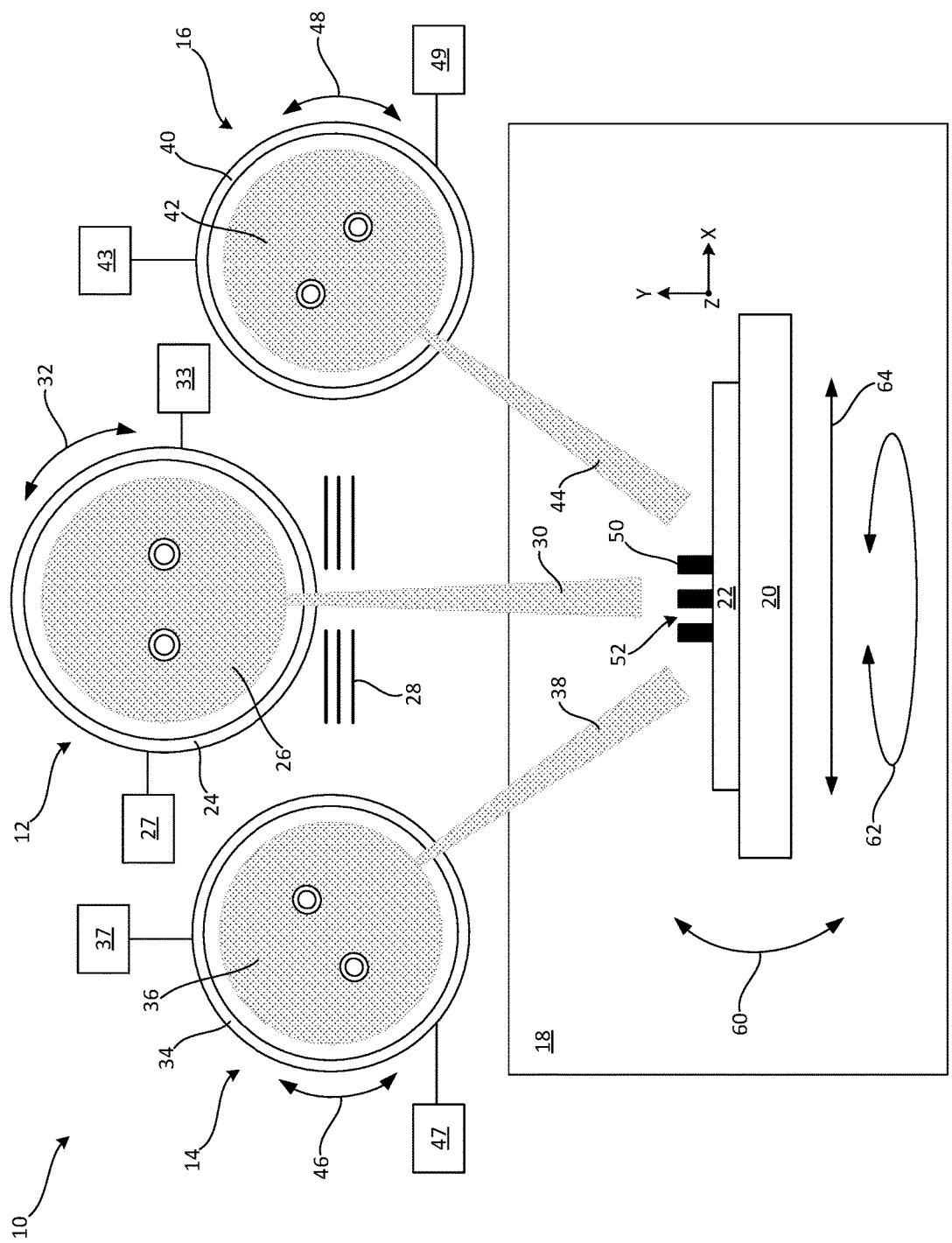
FIG. 1 is a schematic cross-sectional view illustrating an etching and deposition system in accordance with an embodiment of the present disclosure.

The present embodiments will now be described more fully hereinafter with reference to the accompanying drawings, wherein some embodiments are shown. The subject matter of the present disclosure may be embodied in many different forms and is not to be construed as limited to the embodiments set forth herein. These embodiments are provided so this disclosure will be thorough and complete, and will convey certain exemplary aspects of the subject matter to those skilled in the art. In the drawings, like numbers refer to like elements throughout.

Referring to FIG. 1, a schematic cross-sectional view illustrating an etching and deposition system (hereinafter "the system 10") in accordance with an embodiment of the present disclosure is shown. The system 10 may include an reactive-ion etching source 12 (hereinafter "the RIE source 12"), a first ribbon beam plasma enhanced chemical vapor deposition source 14 (hereinafter "the first PECVD source 14") located on a first side of the RIE source 12, a second ribbon beam plasma enhanced chemical vapor deposition source 16 (hereinafter "the second PECVD source 16") located on a second side of the RIE source 12 opposite the first side, and a process chamber 18 located adjacent the aforementioned sources and adapted to receive beams generated by such sources as further described below.

The process chamber 18 may contain a platen 20 adapted to support a substrate 22 (e.g., a silicon wafer) in a confronting relationship with the RIE source 12, the first PECVD source 14, and the second PECVD source 16. In various embodiments, the platen 20 may be adapted to forcibly retain the substrate 22, such as via electrostatic clamping or mechanical clamping. Additionally, the platen 20 may include a heating element (not shown) for controllably heating the substrate 22 to a desired temperature (e.g., a temperature in a range between 0 degrees Celsius and 400 degrees Celsius) to enhance etching and/or deposition processes.

The RIE source 12 may include a reactive-ion plasma chamber 24 configured to generate an energetic plasma 26 from a gaseous species supplied to the reactive-ion plasma chamber 24 by one or more gas sources 27. The RIE source 12 may further include an extraction assembly 28, such as a triode extraction assembly including extraction, suppression, and ground electrodes, adapted to extract an ion beam 30 from the reactive-ion plasma chamber 24 and to direct the ion beam 30 into the process chamber 18 as further described below. In various embodiments, the RIE source may be an ion beam etching (IBE) source. While the RIE source 12 is depicted as being cylindrical in shape (i.e., having a circular cross section), the present disclosure is not limited in this regard, and the RIE source 12 may be implemented in a variety of alterative shapes and configurations. Notably, the RIE source 12 is separate from, and entirely external to, the process chamber 18.

In various non-limiting embodiments, the gas supplied to the reactive-ion plasma chamber 24 may include $NF_3$, $F_2$, $Cl_2$, or any of a family of molecular gases characterized by the chemical formulas $CF_x$ or $C_xH_yF_z$. In various implementations, the RIE source 12 may be biased with respect to the substrate 22 at a given extraction potential (e.g., 100V-5 kV) to provide the ion beam 30 with a desired energy. The RIE source 12 may be adapted to direct the ion beam 30 into the process chamber 18 along a trajectory forming a desired non-zero angle of incidence (e.g., 0 degrees to 60 degrees) with respect to a top surface of the substrate 22, hereinafter referred to as "the substrate plane" (i.e., the X-Z plane of the illustrated Cartesian coordinate system). For example, the RIE source 12 may be rotatable about a longitudinal axis of the reactive-ion plasma chamber 24 (i.e., an axis parallel to the Z-axis of the illustrated Cartesian coordinate system) as indicated the by the arrowed line 32. The RIE source 12 may be rotatably driven by an actuator 33 (e.g., a stepper motor, servo motor, etc.). Thus, the RIE source 12 may be adapted to selectively etch the substrate 22 as further discussed below.

The first PECVD source 14 may include a first radical plasma chamber 34 configured to generate an energetic plasma 36 from a gaseous species supplied to the first radical plasma chamber 34 by one or more gas sources 37, and to emit a flux of radicals, shown as first radical beam 38. Similarly, the second PECVD source 16 may include a second radical plasma chamber 40 configured to generate an energetic plasma 42 from a gaseous species supplied to the second radical plasma chamber 40 by one or more gas sources 43, and to emit a flux of radicals, shown as second radical beam 44. The first and second radical beams 38, 44 may include neutrals. The first and second PECVD sources 14, 16 may be plasma radical sources. In particular embodiments, the first and second PECVD sources 14, 16 may be inductively coupled plasma sources, where reactive radicals are generated from molecular gases including, and not limited to, $SiH_4$, $SiCl_4$, $SiF_4$, $O_2$, $NH_3$, $N_2$, $CH_4$, $CH_3F$, $CHF_3$, $C_2F_4$, or any of a family of molecular gases characterized by the chemical formulas $C_xH_y$ or $C_xF_yH_z$. The present disclosure is not limited in this regard.

The first and second PECVD sources 14, 16 may include respective apertures for directing the first and second radical beams 38, 44 into the process chamber 18 along trajectories at desired non-zero angles of incidence with respect to the substrate plane. For example, the first and second radical plasma chambers 34, 40 may be rotatable about their respective longitudinal axes (i.e., axes parallel to the Z-axis of the illustrated Cartesian coordinate system) as indicated the by the arrowed lines 46, 48. The first and second radical plasma chambers 34, 40 may be rotatably driven by respective actuators 47, 49 (e.g., stepper motors, servo motors, etc.). Thus, the first and second PECVD sources 14, 16 may be adapted to selectively deposit material on a hard mask 50 within the process chamber 18 as further discussed below. Notably, the first and second PECVD sources 14, 16 are separate from, and entirely external to, the process chamber 18.

Figure 2:
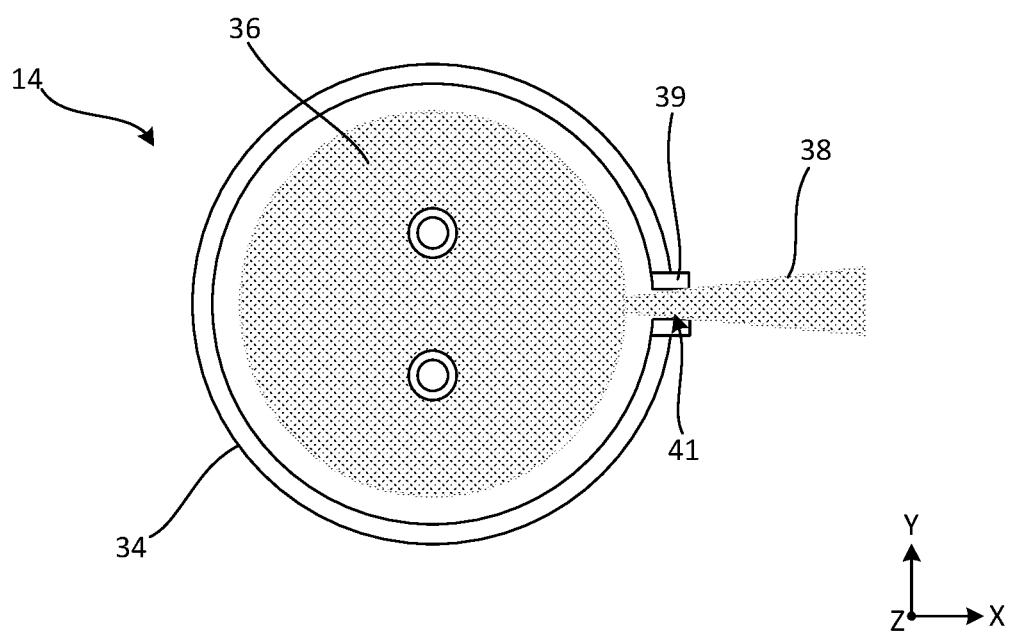
FIG. 2 is a detail cross-sectional view illustrating an embodiment of a radical plasma chamber of the system shown in FIG. 1.

In various embodiments, the first and second radical beams 38, 44 may be given their shape and may be collimated by elongated, low-profile nozzles extending from the first and second radical plasma chambers 34, 40. For example, referring to FIG. 2, the first radical plasma chamber 34 may be provided with a nozzle 39 defining an aperture 41 having a width measured in a direction parallel to the Z-axis (and parallel to a longitudinal axis of the first radical plasma chamber 34) of the illustrated Cartesian coordinate system, and having a height measured in a direction parallel to the Y-axis of the illustrated Cartesian coordinate system. In various embodiments, an aspect ratio of the width of the aperture 41 relative to the height of the aperture 41 may be in a range of 12:1 to 60:1. In specific examples, the aperture 41 may have a width of 300 millimeters and a height in a range of 5 millimeters to 25 millimeters. The present disclosure is not limited in this regard.

The nozzle 39 may extend radially from the first radical plasma chamber 34, thus providing the aperture 41 with a depth as measured in a direction parallel to the X-axis of the illustrated Cartesian coordinate system. In various embodiments, the aperture 41 may have a depth in a range of 7 millimeters to 20 millimeters. In a particular embodiment, the aperture 41 may have a depth of 10 millimeters. The present disclosure is not limited in this regard. Thus, the radially-elongated nozzle 39 may funnel or channel free radicals exiting the first radical plasma chamber 34 in the first radical beam 38, and may tend to collimate the free radicals and facilitate a long mean free path of the free radicals, where the free radicals (and the first radical beam 38 generally) may otherwise tend to diverge after exiting the first radical plasma chamber 34. An intended directionality of the first radical beam 38 may thus be preserved. The second radical plasma chamber 40 may be provided with a similar nozzle.

The RIE source 12, the first PECVD source 14, and the second PECVD source 16 may be independently powered and operated and may be supplied by separate gas sources. Thus, the chemistries within RIE source 12, the first PECVD source 14, and the second PECVD source 16 may be independently varied. For example, the first PECVD source 14 may be configured to deposit a first material in the process chamber 18, and the second PECVD source 16 may be configured to deposit a second material in the process chamber 18, the second material being different than the first material. Alternatively, the first and second materials may be the same. The present disclosure is not limited in this regard.

Still referring to FIG. 1, a hard mask 50 (also commonly referred to as a "photoresist") may be disposed atop the substrate 22. The hard mask 23 may have openings 52 formed therein exposing the underlying substrate 22. During an etching process performed by the system 10, the RIE source 12 may be activated, and an ion beam 30 formed of reactive plasma ions may directed at the hard mask 50. The exposed portions of the underlying substrate 22 (i.e., the portions of the substrate directly below the openings 52) are etched by the ion beam 30 to create desired features (e.g., trenches) therein, while other portions of the substrate 22 are shielded from the ion beam 30 by the hard mask 50.

Ideally, the hard mask 50 is produced with, and maintains, a desired shape for transferring a desired etch pattern with desired dimensions, often referred to as "critical dimensions," to the underlying substrate 22. For example, the hard mask 50 shown in FIG. 1 may represent an ideal shape with perfectly square edges and openings 52 having consistent, uniform widths. In actual practice, the initial openings 52 in the hard mask 50 may be difficult to produce with precision and accuracy and are thus prone to undesirable variations in size and shape. Additionally, etching processes may remove a significant amount of material from the hard mask 50 and/or may modify the shape of the hard mask 50 in an undesirable manner over time.

Figure 3A:
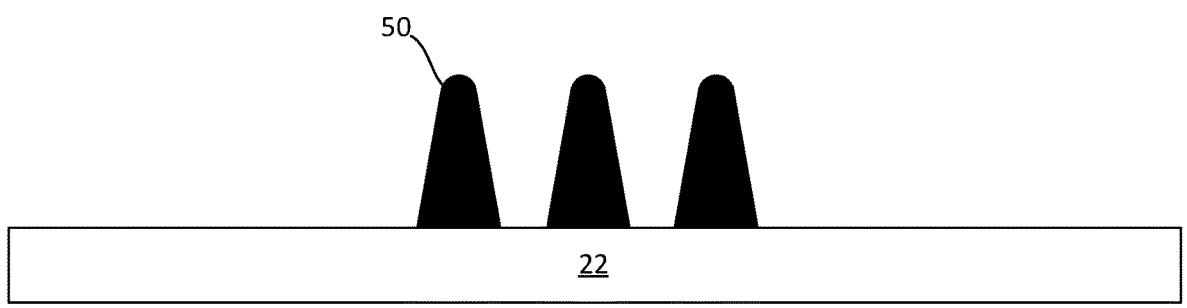
FIG. 3A is a detail view illustrating a substrate and a hard mask of the system shown in FIG. 1.

For example, referring to FIG. 3A, the hard mask 50 is shown having a non-ideal shape (the hard mask 50 and the substrate 22 are shown in isolation for clarity of description). As shown, the hard mask 50 may have a tapered, "shark tooth" profile, with openings 52 that narrow from top to bottom. This may be the initial shape of the hard mask 50 (i.e., the shape of the hard mask 50 prior to exposure to any etching processes), resulting from standard manufacturing processes, or may be the result of exposure to etching processes that have removed material from the hard mask 50 over time (which may produce a more peaked or pointed profile than that shown in FIG. 3A). In either case, the non-ideal shape of the hard mask 50 may result in undesirable patterns being etched into the substrate 22. For example, the critical dimensions of features etched into the substrate, such as the widths of trenches, fins, etc., may vary from desired values. Such variations can be detrimental to the performance of a resulting semiconductor device.

Figure 3B:
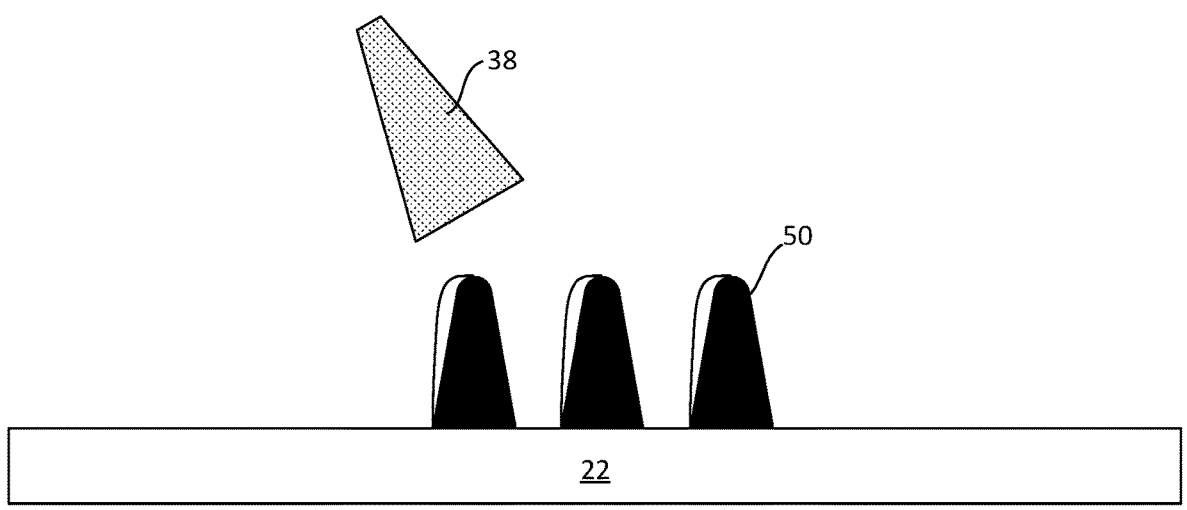
FIG. 3B is a detail view illustrating a first deposition process being performed on the hard mask shown in FIG. 3A.

The system 10 of the present disclosure addresses the above-described problem by implementing the first PECVD source 14 and the second PECVD source 16 to improve and maintain the shape of the hard mask 50 to produce etches in the substrate 22 with desired shapes and critical dimensions. For example, referring to FIG. 3B, the first radical beam 38 from the first PECVD source 14 (see FIG. 1) may be directed at a first side of the hard mask 50 (the left side as shown in FIG. 3B) at a specified angle to perform a directional deposition on the first side. In a non-limiting example, the angle may be in a range of 0 degrees to 75 degrees relative to the substrate plane. The desired angle may be achieved by rotating the first PECVD source 14 about its longitudinal axis as described above. Additionally or alternatively, the platen 20 and the substrate 22 may be tilted about an axis parallel to the X-axis of the illustrated Cartesian coordinate system as indicated by the arrowed line 60 in FIG. 1, rotated about an axis parallel to the Y-axis of the illustrated Cartesian coordinate system as indicated by the arrowed line 62 in FIG. 1, or scanned along the X-axis of the illustrated Cartesian coordinate system as in FIG. 1 as indicated by the arrowed line 64 in FIG. 1 to achieve a desired deposition on the hard mask 50. Thus, the deposition performed in FIG. 3B may add material to the first side of the hard mask 50, with more material being added to an upper portion of the first side and less material being added to a lower portion of the first side, to provide the first side with a shape/profile closer to the ideal shape/profile illustrated in FIG. 1.

Figure 3C:
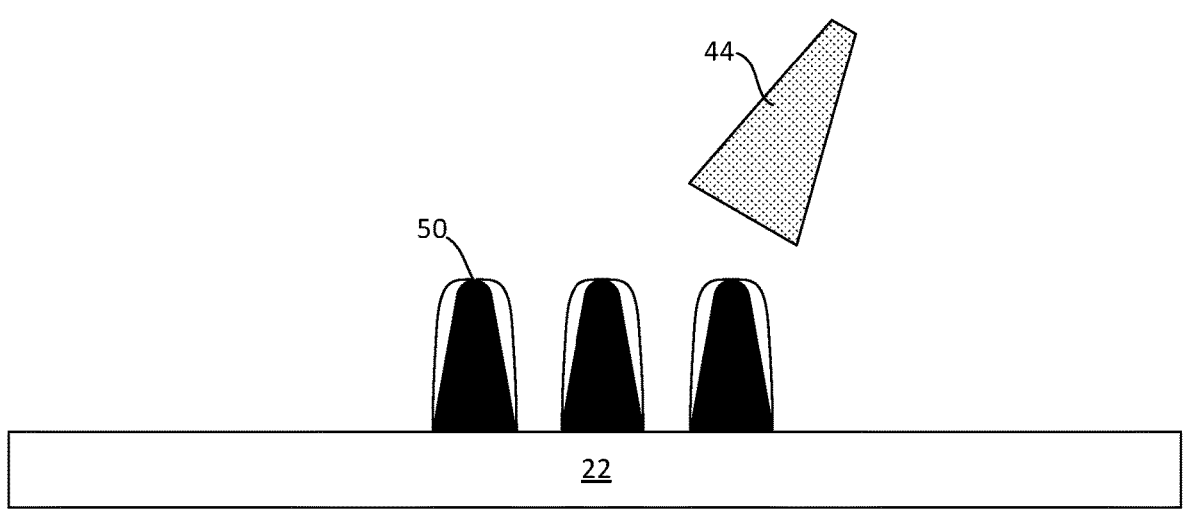
FIG. 3C is a detail view illustrating a second deposition process being performed on the hard mask shown in FIG. 3A.

Referring to FIG. 3C, the second radical beam 44 from the second PECVD source 16 (see FIG. 1) may be directed at a second side of the hard mask 50 (the right side as shown in FIG. 3C) at a specified angle to perform a directional deposition on the second side. In a non-limiting example, the angle may be in a range of 0 degrees to 60 degrees relative to the substrate plane. As with the operation described above with respect to the first PECVD source 14, the desired angle may be achieved by rotating the second PECVD source 16 about its longitudinal axis as described above. Additionally or alternatively, the platen 20 and the substrate 22 may be tilted, rotated, or scanned to achieve a desired deposition on the hard mask 50. Thus, the deposition performed in FIG. 3C may add material to the second side of the hard mask 50, with more material being added to an upper portion of the second side and less material being added to a lower portion of the second side, to provide the second side with a shape/profile closer to the ideal shape/profile illustrated in FIG. 1.

The above-described deposition processes may be performed when the hard mask 50 is first introduced into the system 10, prior to being exposed to any etching processes, to rectify undesirable variations in the shape of the hard mask 50 that may result from manufacturing processes. Additionally or alternatively, the above described deposition processes may be performed after the system has performed one or more etching processes (i.e., using the RIE source 12) that may deteriorate the hard mask 50, and may be cyclically repeated as necessary in order to maintain the shape of the hard mask 50.

The system 10 has been described above as including a first PECVD source 14 and a second PECVD source 16. Alternative embodiments are contemplated wherein the system 10 includes three or more PECVD sources, such as may be desirable for implementing additional deposition chemistries. Still further, alternative embodiments are contemplated wherein the system 10 includes only one PECVD source, with the platen 20 and the substrate 22 being rotated to facilitate deposition on both sides of the hard mask 50 using the single PECVD source. The present disclosure is not limited in this regard.

Those of ordinary skill in the art will appreciate the numerous benefits provided by the above-described system associated methods. For example, the system and methods of the present disclosure may facilitate the initial correction of a hard mask (i.e., correction prior to exposure to etching processes) that fails to conform to a desired shape, profile, and/or critical dimensions due to manufacturing limitations. Additionally, the system and methods of the present disclosure may facilitate the maintenance of a desired shape, profile, and/or critical dimensions of a hard mask after being degraded by exposure to etching processes. Additionally, since the RIE source 12, the first PECVD source 14, and the second PECVD source 16 are separate from one another and separate from the processes chamber 18, the chemistries within RIE source 12, the first PECVD source 14, and the second PECVD source 16 may be independently varied to perform directional etching and deposition processes with different species and materials.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. An etching and deposition system comprising:
a process chamber containing a platen for supporting a substrate;
an reactive-ion etching (RIE) source adapted to produce an ion beam and to direct the ion beam into the process chamber for etching the substrate;
a first plasma enhanced chemical vapor deposition (PECVD) source located on a first side of the RIE source, the first PECVD source adapted to produce a first radical beam and to direct the first radical beam into the process chamber for depositing a first material; and
a second PECVD source located on a second side of the RIE source opposite the first side, the second PECVD source adapted to produce a second radical beam and to direct the second radical beam into the process chamber for depositing a second material.

2. The etching and deposition system of claim 1, wherein the RIE source comprises an reactive-ion plasma chamber adapted to receive a first gaseous species from a first gas source, the first PECVD source comprises a first radical plasma chamber adapted to receive a second gaseous species from a second gas source, and the second PECVD source comprises a second radical plasma chamber adapted to receive a third gaseous species from a third gas source.

3. The etching and deposition system of claim 2, wherein the first gaseous species is different than the second gaseous species, and the third gaseous species is different from the first gaseous species and the second gaseous species.

4. The etching and deposition system of claim 2, wherein the first gaseous species is different than the second gaseous species, and the third gaseous species is the same as the second gaseous species.

5. The etching and deposition system of claim 2, wherein the first gaseous species and the second gaseous species are characterized by one of the following chemical formulas: $CF_x$ and $C_xH_yF_z$.

6. The etching and deposition system of claim 1, wherein the RIE source is rotatable for varying an angle of incidence of the ion beam relative to the substrate, the first PECVD source is rotatable for varying an angle of incidence of the first radical beam relative to the substrate, and the second PECVD source is rotatable for varying an angle of incidence of the second radical beam relative to the substrate.

7. The etching and deposition system of claim 6, wherein the angle of incidence of the ion beam relative to the substrate is different than the angle of incidence of the first radical beam relative to the substrate, and the angle of incidence of the second radical beam relative to the substrate is different than the angle of incidence of the first radical beam relative to the substrate and the angle of incidence of the ion beam relative to the substrate.

8. A method of performing an etching process using an etching and deposition system including a process chamber, an reactive-ion etching (RIE) source adapted to produce an ion beam and to direct the ion beam into the process chamber, a first plasma enhanced chemical vapor deposition (PECVD) source located on a first side of the RIE source, the first PECVD source adapted to produce a first radical beam and to direct the first radical beam into the process chamber, and a second PECVD source located on a second side of the RIE source opposite the first side, the second PECVD source adapted to produce a second radical beam and to direct the second radical beam into the process chamber, the method comprising:

disposing a substrate on a platen within the process chamber, the substrate having a top surface defining a substrate plane;

disposing a hard mask on the top surface of the substrate, the hard mask having openings defining a pattern to be transferred to the substrate;

performing an etching process wherein the RIE source is activated and the ion beam is directed onto the hard mask to etch the pattern into the substrate;

performing a first deposition process wherein the first PECVD source is activated and the first radical beam is directed at a first side of the hard mask to deposit a first material on the first side of the hard mask; and performing a second deposition process wherein the second PECVD source is activated and the second radical beam is directed at a second side of the hard mask opposite the first side to deposit a second material on the second side of the hard mask.

9. The method of claim 8, wherein the first material and the second material are the same.

10. The method of claim 8, wherein the first material and the second material are different.

11. The method of claim 8, further comprising rotating at least one of the first PECVD source to adjust an angle of incidence of the first radical beam relative to the substrate plane and the second PECVD source to adjust an angle of incidence of the second radical beam relative to the substrate plane.

12. The method of claim 8, further comprising rotating the RIE source to adjust an angle of incidence of the ion beam relative to the substrate plane.

13. The method of claim 8, further comprising performing at least one of rotating the platen, tilting the platen, and scanning the platen.

14. The method of claim 8, wherein at least one of the first deposition process and the second deposition process is performed before any etching processes are performed on the substrate in the process chamber.

15. The method of claim 8, wherein the etching process, the first deposition process, and the second deposition process are repeated in a cyclical manner to maintain a desired profile of the hard mask.

16. A method of performing an etching process using an etching and deposition system including a process chamber, an reactive-ion etching (RIE) source adapted to produce an ion beam and to direct the ion beam into the process chamber, and a plasma enhanced chemical vapor deposition (PECVD) source located adjacent the RIE source, the PECVD source adapted to produce a radical beam and to direct the radical beam into the process chamber, the method comprising:

disposing a substrate on a platen, the substrate having a top surface defining a substrate plane;

disposing a hard mask on the top surface of the substrate, the hard mask having openings defining a pattern to be transferred to the substrate;

performing an etching process wherein the RIE source is activated and the ion beam is directed onto the hard mask to etch the pattern into the substrate;

performing a first deposition process wherein the PECVD source is activated and the radical beam is directed at a first side of the hard mask to deposit a material on the first side of the hard mask;

rotating the platen; and performing a second deposition process wherein the PECVD source is activated and the radical beam is directed at a second side of the hard mask opposite the first side to deposit the material on the second side of the hard mask.

17. The method of claim 16, further comprising rotating the PECVD source to adjust an angle of incidence of the radical beam relative to the substrate plane.

18. The method of claim 16, further comprising rotating the RIE source to adjust an angle of incidence of the ion beam relative to the substrate plane.

19. The method of claim 16, further comprising performing at least one of rotating the platen, tilting the platen, and scanning the platen.

20. The method of claim 16, wherein at least one of the first deposition process and the second deposition process is performed before any etching processes are performed on the substrate in the process chamber.

21. The method of claim 16, wherein the etching process, the first deposition process, and the second deposition process are repeated in a cyclical manner to maintain a desired profile of the hard mask.

* * * * *